United States Patent [19]

Green et al.

[11] 4,136,376
[45] Jan. 23, 1979

[54] PHOTOFLASH LAMP ARRAY CIRCUIT BOARD HAVING ELECTRICAL INSULATION

[75] Inventors: David H. Green, Mattoon, Ill.; Edward J. Collins, Mentor-on-the-Lake; Vaughn C. Sterling, Cleveland Heights, both of Ohio

[73] Assignee: General Electric Company, Schenectady, N.Y.

[21] Appl. No.: 843,589

[22] Filed: Oct. 19, 1977

Related U.S. Application Data

[63] Continuation-in-part of Ser. No. 751,537, Dec. 16, 1976.

[51] Int. Cl.² ............................................. G03B 15/02
[52] U.S. Cl. ..................................... 362/10; 362/11; 362/13; 431/359; 431/365; 361/411
[58] Field of Search ........................... 362/10, 11, 13; 431/95 A; 361/411

[56] References Cited

U.S. PATENT DOCUMENTS 4,060,721  11/1977  Hanson et al. ..................... 362/13

*Primary Examiner*—Stephen J. Lechert, Jr.
*Attorney, Agent, or Firm*—John F. McDevitt; Lawrence R. Kempton; Frank L. Neuhasuer

[57] ABSTRACT

An electrically insulative adhesive coating for a circuit board used with a photoflash lamp array to provide sequential firing of the flash lamps. The circuit board includes the lamp firing circuitry along with switching elements connected in said circuitry and the insulative coating prevents electrical shorting of the circuitry. In a preferred embodiment, the coating material may be an organic polymer and may be provided with openings to permit radiation transfer from the flashing lamps to the underlying switches which are radiation-responsive.

8 Claims, 2 Drawing Figures

PHOTOFLASH LAMP ARRAY CIRCUIT BOARD HAVING ELECTRICAL INSULATION

This application is a continuation-in-part of application Ser. No. 751,537, filed Dec. 16, 1976, and assigned to the assignee of the present invention.

BACKGROUND OF THE INVENTION

U.S. Pat. No. 3,952,320 to Richard Blount discloses an electric multiple flash lamp arrangement having the lamps connected to a circuit board which carries the sequential firing circuitry and is provided with a pair of connectors for attachment of the flash lamp array to a camera. In a known multiple flash arrangement of this kind, eight flash lamps are provided on the circuit board. These flash lamps are arranged in two rows of four lamps, one above the other. The flash lamps are electrically connected in such a way that fires the upper group of four lamps. By turning said arrangement 180° and reinserting the remaining connector into the flash lamp socket, the remaining group of four flash lamps can be ignited and such an arrangement eliminates or reduces the undesirable "red eye" effect. In related U.S. Pat. No. 3,894,226 to James M. Hanson, there is disclosed such a photoflash lamp array having means for preventing electrical shorting of the circuitry on the circuit board with an insulating sheet member which may be made of plastic and is interposed between the reflector unit of the arrangement and the circuit board. The insulating sheet may also be provided with openings over underlying radiation-sensitive switches in the lamp firing circuitry to permit radiation transfer from the flashing lamps to said radiation-sensitive switches.

While the above summarized electrical insulation achieves the desired purpose, it is an object of the present invention to provide an improved electrical insulation which is integral with the circuit board and has other advantages. Particularly, the present insulation provides a hermetic seal for the underlying switching elements from environmental conditions. Said insulation can be used with radiation-responsive switching elements, of the type above referenced, as well as with voltage-responsive switching elements connected to the circuitry which are converted to an electrically conductive state by the lamp firing pulse. Voltage responsive switches operating in this manner are disclosed in U.S. Pat. No. 3,532,931, Cote et al., which is also assigned to the assignee of the present invention. The present insulation coating further provides better containment of the switch material when being converted during circuit operation. The present insulation still further reduces switch abrasion during manufacture of the flash lamp array.

SUMMARY OF THE INVENTION

These and other objects of the present invention are achieved when the radiation or voltage responsive switching elements are coated with an electrically insulative adhesive coating to prevent shorting of the circuitry. The adhesive coating may comprise an organic polymer which can either cover the underlying switches alone or provide a continuous layer bonded to the circuit board and having openings for electrical termination of the lamps to the circuitry. Commercially available synthetic organic polymers can be selected to provide the insulative adhesive coating so long as a selected material is reasonably moisture-resistant and can be adhesively bonded to the circuit board material. The bonded insulative coating should also not be unduly subject to burning when the underlying switch element undergoes conversion or produce undesirable by-products.

In a preferred embodiment, the radiation or voltage responsive switches are provided adjacent to the flash lamps to permit sufficient radiation transfer from said lamps to actuate the proximate switches located below. The adhesive coating can cover only the subjacent switch devices and the radiation responsive type of switching devices can be provided with openings to permit radiation transfer from the overlying lamps.

In a different preferred embodiment, the adhesive coating provides a continuous layer bonded to the circuit board having additional openings for electrical termination of the flash lamps to the underlying circuitry.

DESCRIPTION OF THE PREFERRED EMBODIMENTS

Figure 1:
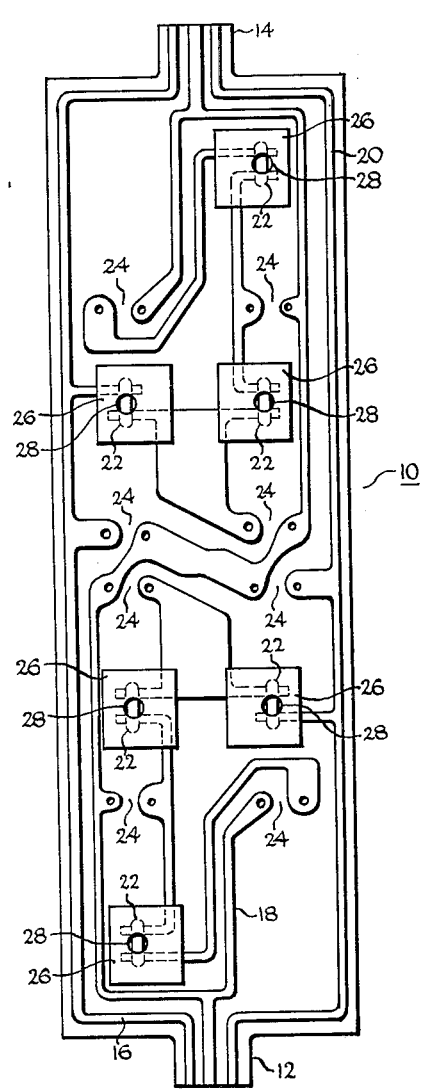
FIG. 1 is an illustration of a known multiple flash lamp circuit board having an insulative coating over switching devices connected in the circuitry.

The circuit arrangement of FIG. 1 is generally the same as disclosed in the above referenced U.S. patents, which include circuit board member 10 having connector tabs 12 and 14 located at each end for insertion of the circuit board to an associated camera socket (not shown). The camera socket has contacts for conductor lines 16, 18 and 20 of the circuit board for connection of four flash lamps in parallel between conductor lines 16 and 18 when connector tab 12 has been inserted in the camera socket. Correspondingly, the remaining group of four lamps is connected between conductor lines 18 and 20 when connector tab 14 has been inserted into the camera socket. Conductor lines 16 and 20 are interrupted by radiation switches 22 to prevent the flash lamps in a group from all being fired together on release of the camera shutter. As can be noted, the switches 22 are each arranged in a region of a flash lamp termination 24 so that the heat and light released when the flash lamp is fired operates to convert the respective switch from a non-conductive to an electrically-conductive state, thus establishing a current path to the next lamp to be flashed.

The electrically insulative adhesive coating 26 overlies only that portion of the circuit board where the radiation-sensitive switch devices 22 reside and is further provided with openings 28 for radiation transfer from the flashing lamps to the underlying radiation-sensitive switch devices. Accordingly, when a particular flash lamp in the circuit is flashed, then the adjacent radiation switch is actuated providing a current path to the next lamp to be flashed. Each of the radiation switches are in contact and bridge across the conductor lines of the electrical circuit with the material employed in the radiation switch initially having an open circuit or high resistance condition and with said resistance thereafter becoming zero or a low value when the material receives radiation and/or heat from an adjacent flash lamp upon firing of said lamp. A more detailed description of the sequential firing operation for said electrical circuit is found in the aforementioned U.S. patents hence need not be repeated in the present application. Substitution of voltage responsive switches for the switch devices 22 in the above described embodiment results in modified circuit operation so that switch conversion from a non-conductive to a conductive state takes place upon actuation by a succesive lamp firing pulse.

Figure 2:
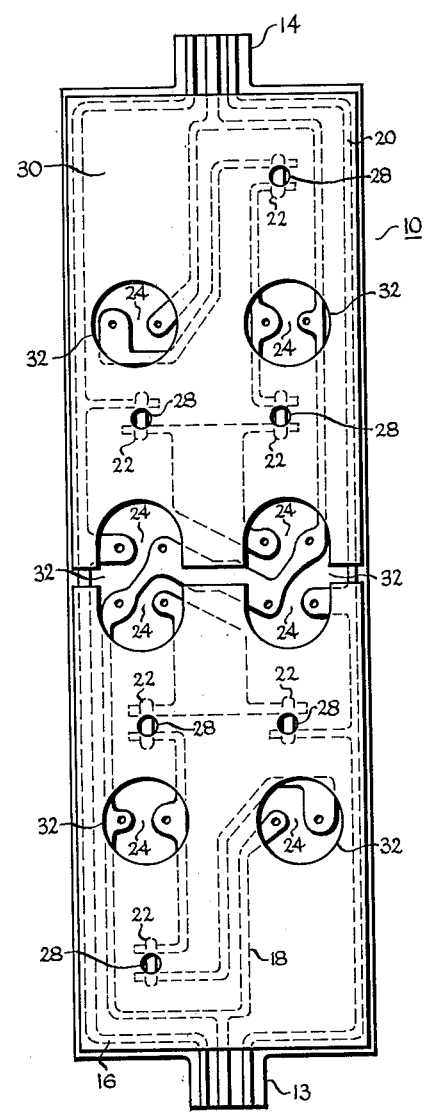
FIG. 2 is an illustration of the same type circuit board having a continuous insulative layer bonded to the circuit board with openings being provided for electrical termination of the flash lamps.

In FIG. 2 there is shown a circuit board construction having the same general arrangement as previously described with reference to FIG. 1. The same reference designations have therefore been employed as in FIG. 1 with respect to the common elements in said circuit board. The principal distinctions are utilization of a continuous layer 30 of the adhesive insulating coating which overlies the entire circuit board except for radiation transfer openings 28 (which have been previously described) and a further series of openings 32 permitting electrical termination of the flash lamps (not shown) to the underlying circuitry.

While preferred embodiments of the invention have been shown and described, various other embodiments and modifications thereof will become apparent to persons skilled in the art, and thereby fall within the scope of the invention as defined in the following claims.

What we claim as new and desire to secure by Letters Patent of the United States is:

1. In a circuit board for a photoflash lamp array having lamp firing circuitry thereon to fire a plurality of flash lamps electrically connected thereto and switch devices connected in said circuitry for sequentially firing said lamps, the improvement wherein said switches are coated with an electrically insulative adhesive coating to prevent shorting of the circuitry.

2. The circuit board of claim 1 wherein the adhesive coating comprises an organic polymer.

3. The circuit board of claim 1 wherein the adhesive coating covers only the switch devices.

4. The circuit board of claim 1 wherein the adhesive coating provides a continuous layer bonded to the circuit board having openings for electrical termination of the lamps to the circuitry.

5. In a circuit board for a photoflash lamp array having lamp firing circuitry thereon to fire a plurality of flash lamps electrically connected thereto and radiation-sensitive switches connected in said circuitry for sequentially firing said lamps when activated by radiation transferred from adjacent flashing lamps, the improvement wherein said radiation-sensitive switches are coated with an electrically insulative adhesive coating to prevent shorting of the circuitry which includes openings to permit radiation transfer from the flashing lamps to the radiation-sensitive switches.

6. The circuit board of claim 5 wherein the adhesive coating comprises an organic polymer.

7. The circuit board of claim 5 wherein the adhesive coating covers only the radiation-sensitive switches.

8. The circuit board of claim 5 wherein the adhesive coating provides a continuous layer bonded to the circuit board having additional openings for electrical termination of the lamps to the circuitry.

* * * * *